(12) United States Patent
Yang et al.

(10) Patent No.: US 8,649,411 B2
(45) Date of Patent: Feb. 11, 2014

(54) VERTICAL-CAVITY SURFACE-EMITTING LASER DEVICE HAVING RELIEF STRUCTURE

(75) Inventors: Ying-Jay Yang, Taipei (TW); Jin-Wei Shi, Taipei (TW)

(73) Assignee: National Central University, Jhongli (TW)

( * ) Notice: Subject to any disclaimer, the term of this patent is extended or adjusted under 35 U.S.C. 154(b) by 220 days.

(21) Appl. No.: 13/026,642

(22) Filed: Feb. 14, 2011

(65) Prior Publication Data

US 2012/0163407 A1    Jun. 28, 2012

(30) Foreign Application Priority Data

Dec. 22, 2010 (TW) .............................. 99145146 A

(51) Int. Cl.
*H01S 5/00* (2006.01)
(52) U.S. Cl.
USPC ...................................... 372/50.11

(58) Field of Classification Search
USPC ............. 372/75, 50.11, 45.01, 43.01, 50.124
See application file for complete search history.

(56) References Cited

U.S. PATENT DOCUMENTS

| | | | |
|---|---|---|---|
| 2003/0169795 A1* | 9/2003 | Otoma et al. ................... | 372/46 |
| 2004/0114653 A1* | 6/2004 | Omori ............................. | 372/46 |
| 2009/0201965 A1* | 8/2009 | Yoshikawa et al. ...... | 372/50.124 |
| 2010/0080258 A1* | 4/2010 | Ikuta ........................ | 372/46.013 |

* cited by examiner

*Primary Examiner* — Jessica Stultz
*Assistant Examiner* — Tuan Nguyen
(74) *Attorney, Agent, or Firm* — Jackson IPG PLLC

(57) ABSTRACT

The present disclosure is a vertical-cavity surface-emitting laser (VCSEL) device. A relief structure is formed above or below a light emitting region by partially removing an aluminum composition layer of VCESL through an etching process. Thus, profound static performances are obtained, including low power consumption, biggest operational speed, and high ratio of data transmission to power consumption as 2.9 and 9.2 Gbps/mW under 34 and 12.5 Gbps, respectively.

11 Claims, 8 Drawing Sheets

VERTICAL-CAVITY SURFACE-EMITTING LASER DEVICE HAVING RELIEF STRUCTURE

TECHNICAL FIELD OF THE DISCLOSURE

The present disclosure relates to vertical-cavity surface-emitting laser (VCSEL); more particularly, relates to forming a relief structure above or below an active layer through an etching process.

DESCRIPTION OF THE RELATED ARTS

A VCSEL having high speed, profound performance and low threshold current (<1 mA) is widely noticed to be used in optical connection. VCSEL is evaluated by two parameters: one is current modulation efficiency (D-factor) and the other is threshold current ($I_{th}$). Under a big D-factor and a small $I_{th}$, a high modulation speed is obtained with a low bias current; and, thus, only little power is consumed for a high-speed VCSEL.

For further enhancing the high-speed VCSEL, gallium arsenide (GaAs) based VCSEL having multiple quantum wells (MQWs) (InGaAs/GaAs(P)) has proved to have good performance on speed and power consumption at 850 nm and 1000 nm bandwidth. Moreover, for enhancing modulation speed to around 40 Gbit/sec, multiple oxide layers are usually used to further reduce high parasitic capacity of oxide-confined VCSEL. However, stress over light emitting region may reduce reliability of VCSEL. Besides, insulation layer on top of distributed Bragg reflector (DBR) of VCSEL may increase resistance, turn on voltage and power consumption of VCSEL and, thus, limits high-speed performance of VCSEL when being operated at a high temperature. Hence, the prior arts do not fulfill all users' requests on actual use.

SUMMARY OF THE DISCLOSURE

The main purpose of the present disclosure is to form a relief structure at least 100 nm above or below an active layer to remove an oxide layer of 850 nm bandwidth VCESL through an etching process, where profound static performances are obtained, including low power consumption, biggest operational speed, and high ratio of data transmission to power consumption as 2.9 and 9.2 Gbps/mW under 34 and 12.5 Gbps, respectively.

To achieve the above purpose, the present disclosure is a VCSEL device, comprising a substrate, an extended structure, an insulation layer, an n-type contact, a p-type contact, an n-type metal pad and a p-type metal pad, where the extended structure is positioned on the substrate and comprises a first DBR, a light emitting region and a second DBR; where the light emitting region has MQWs and is located between the first DBR and the second DBR; where the light emitting region has a relief structure above the light emitting region; where the relief structure is an aluminum (Al) composition layer partially laterally etched off to define a central current-confined area; where the Al composition layer contains Al more than twenty percents; where the relief structure is formed by an oxidation process and an etching process; where the relief structure has a distance at least 100 nm to the light emitting region; where the insulation layer has a light emitting aperture; where the insulation layer is extended from two ends of the light emitting aperture to cover the second DBR, the light emitting region and a part of the first DBR; where the relief structure is positioned within area between the two extended ends of the insulation layer to align center of the light emitting aperture with the central current-confined area; where the n-type contact is located in the insulation layer and positioned on an interface between the insulation layer and the first DBR; where the p-type contact is located in the insulation layer and positioned on the top of second DBR; where the n-type metal pad is formed on the insulation layer and electrically connected with the n-type contact through a penetrated hole in the insulation layer; and where the p-type metal pad is formed on the insulation layer and electrically connected with the p-type contact through a penetrated hole in the insulation layer. Accordingly, a novel VCSEL device having a relief structure is obtained.

BRIEF DESCRIPTIONS OF THE DRAWINGS

The present disclosure will be better understood from the following detailed description of the preferred embodiment according to the present disclosure, taken in conjunction with the accompanying drawings, in which FIG. 1 is the cross-sectional view showing the preferred embodiment according to the present disclosure;

Figure 5A:
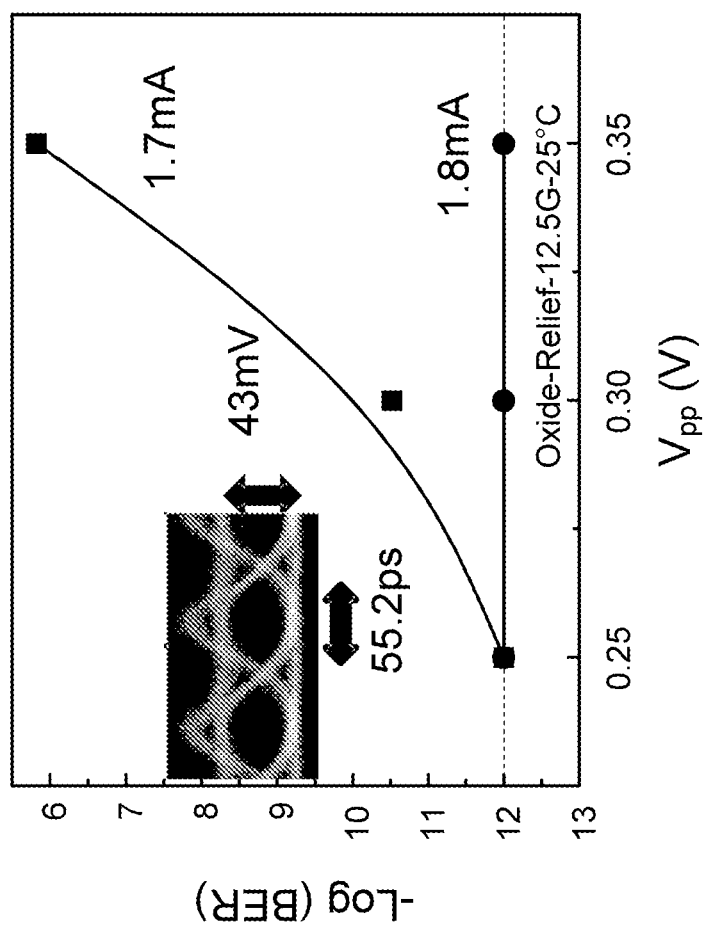
FIG. 5A is the view showing the $-\log(BER)$-to-$V_{pp}$ curves with 12.5 Gbit/sec bias current.
Figure 5B:
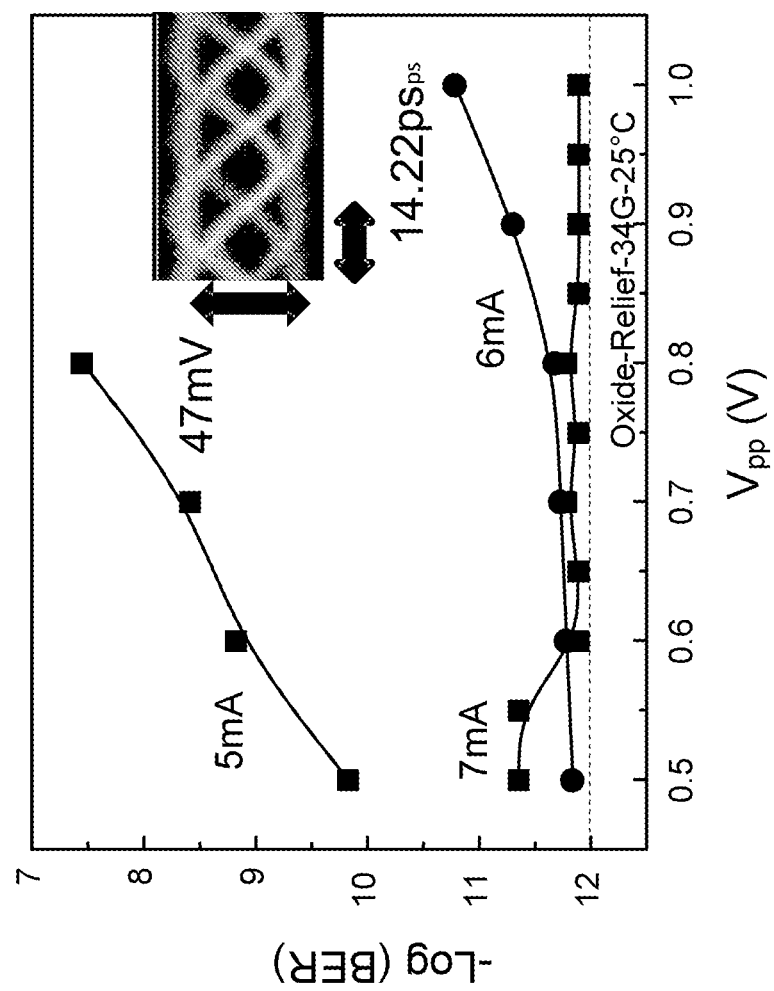
Figure 5C:
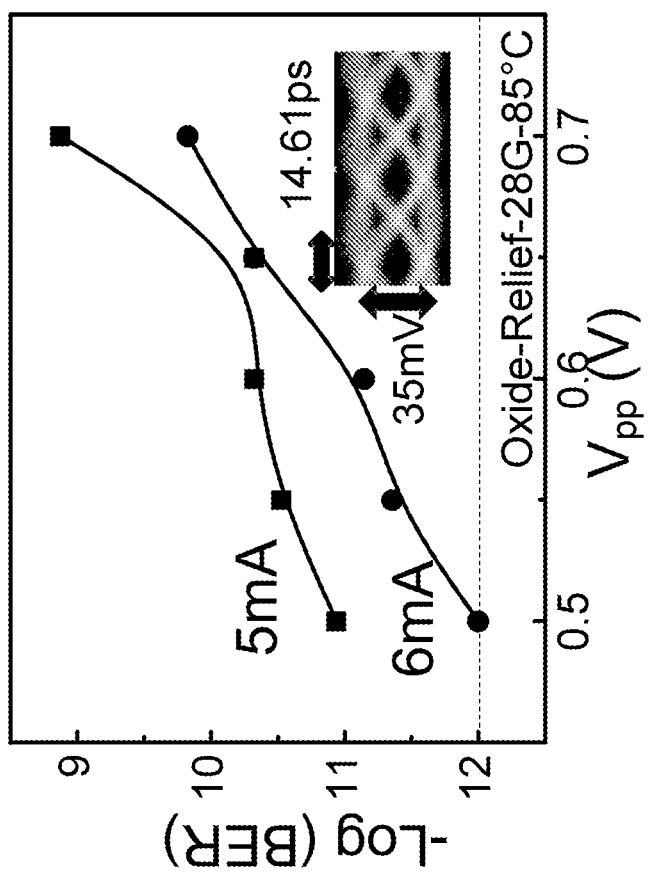

FIG. 5B is the view showing the $-\log(BER)$-to-$V_{pp}$ curves with 34 Gbit/sec bias current; and FIG. 5C is the view showing the $-\log(BER)$-to-$V_{pp}$ curves with 28 Gbit/sec bias current under 85° C.

DESCRIPTION OF THE PREFERRED EMBODIMENT

The following description of the preferred embodiment is provided to understand the features and the structures of the present disclosure.

Figure 1:
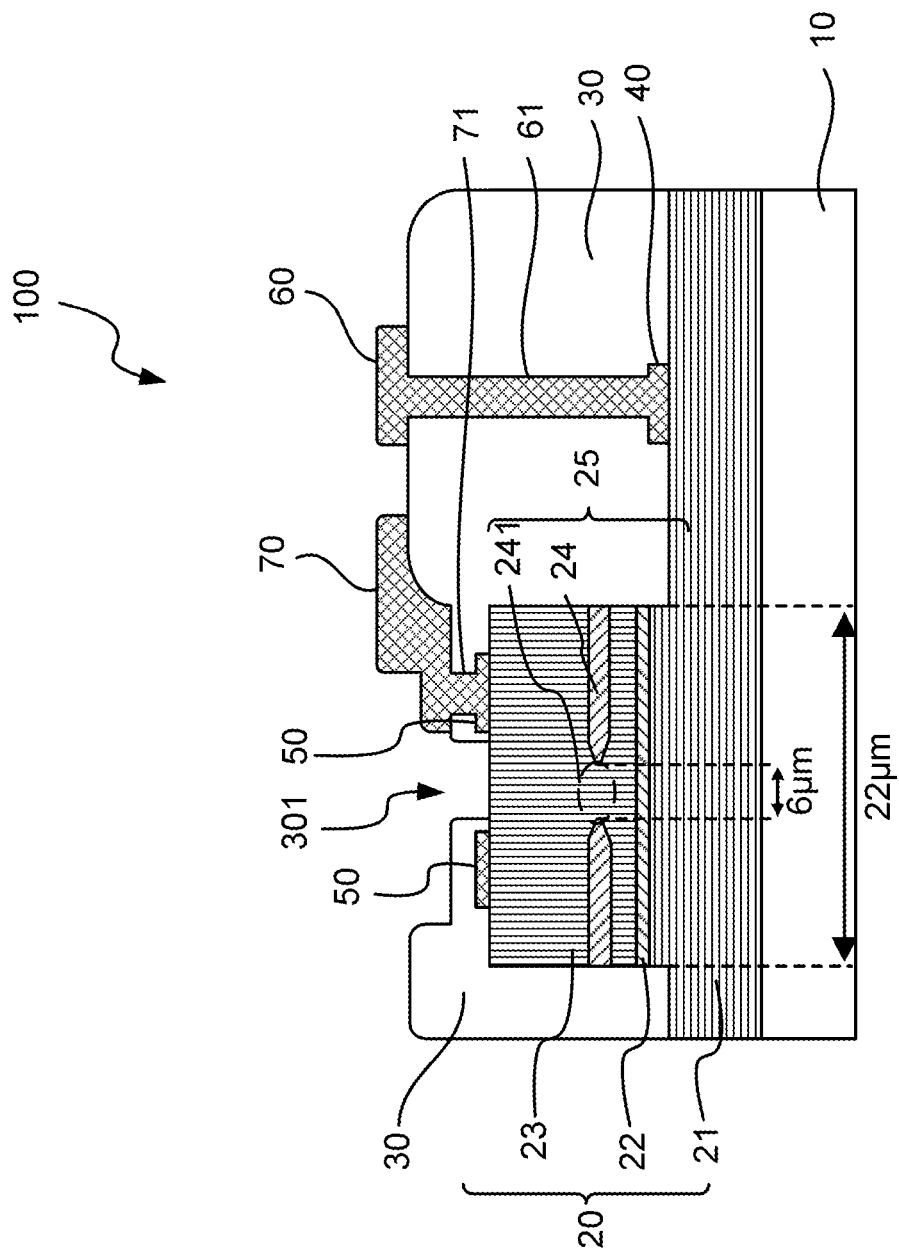
Figure 2:
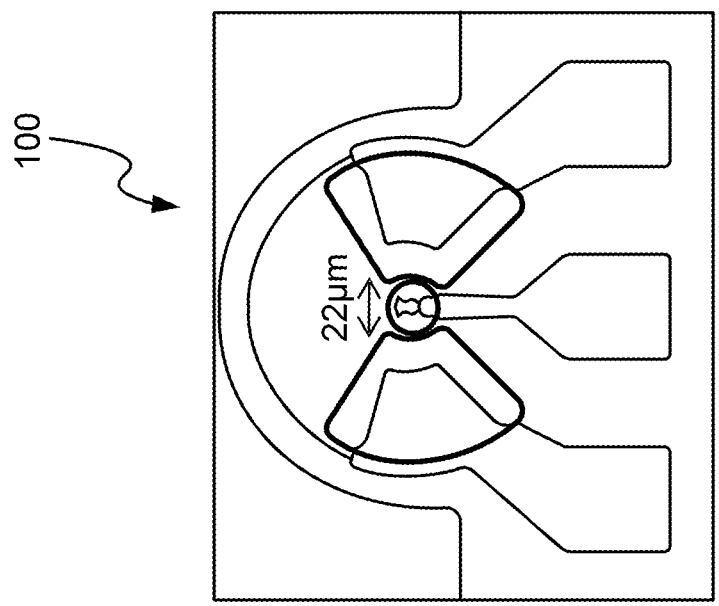
FIG. 2 is the top-down view showing the preferred embodiment.

Please refer to FIG. 1 and FIG. 2, which are a cross-sectional view and a top-down view showing a preferred embodiment according to the present disclosure. As shown in the figures, the present disclosure is a vertical-cavity surface-emitting laser (VCSEL) device [100], which has a relief structure [24] formed at least 100 nanometers (nm) above an active area by an oxidation process and an etching process. The present disclosure comprises a substrate [10], an extended structure [20], an insulation layer (bisbenzocyclobutene, BCB) [30], an n-type contact [40], an n-type metal pad [60], a p-type contact [50], and a p-type metal pad [70].

The substrate [10] is preferably a semi-insulated semiconductor, where the semi-insulated semiconductor is preferably gallium arsenide (GaAs), indium phosphide (InP), aluminum nitride (AlN), indium nitride (InN) or silicon (Si).

The extended structure [20] is grown on the substrate [10] and comprises a first distributed Bragg reflector (DBR) [21], a light emitting region [22] and a second DBR [23], where the light emitting region [22] preferably has multiple quantum wells (MQWs) between the first DBR [21] and the second DBR [23]; after growth of extended structure, a mesa structure [25] is formed by chemical etching and the mesa structure [25] consists of a part of first DBR [21], the light emitting region [22], the second DBR [23], and a relief structure [24]; where a relief structure [24] is located above the light emitting region [22] and does not touch the light emitting region [22]; where the relief structure [24] is originally an aluminum (Al) composition layer as grown, then partially laterally etched off to define a central current-confined area [241] having a diameter of less than 25 micrometers (μm); where the Al composition layer contains Al more than twenty percents in group III element; where the relief structure [24] can be also formed by an oxidation process and an etching process, where the relief structure has a distance at least 100 nanometers (nm) to the light emitting region [22]; and where the MQW is a heterojunction made of a compound semiconductor and an alloy of said compound semiconductor and is preferably InAlGaAs/AlGaAs.

The insulation layer [30] has a light emitting aperture [301], where the insulation layer [30] extends from two ends of the light emitting aperture [301] to cover the second DBR [23], the light emitting region [22] and a part of the first DBR [21]; where the relief structure [24] is contained within area between the extended two ends of the insulation layer [30]; and where center of the light emitting aperture [301] is thus aligned with the central current-confined area [241].

The second DBR [23], the light emitting region [22] and the first DBR [21] are laterally covered by the insulation layer [30].

The n-type contact [40] is buried in the insulation layer [30] and is located on an interface between the insulation layer [30] and the first DBR [21].

The p-type contact [50] is buried in the insulation layer [30] and is located on the top of the second DBR [23].

The n-type metal pad [60] is formed on the insulation layer [30] and has a penetrated hole [61] in the insulation layer [30] for being electrically connected with the n-type contact [40].

The p-type metal pad [70] is formed on the insulation layer [30] and has a penetrated hole [71] in the insulation layer [30] for being electrically connected with the p-type contact [50].

The light emitting region [22] is sandwiched by the first DBR [21] and the second DBR [23] through epitaxy growth.

In FIG. 2, on using the present disclosure, the VCSEL device [100] has a circular mesa top having a 22 μm diameters, where the VCSEL device [100] is integrated with a co-planar waveguide (CPW) pad for high-speed on-wafer measurement.

In a state of art, the Al composition layer is partially converted into an oxide layer with central area of the Al composition layer remained intact and the oxide layer is processed through selective-etching by using a buffered oxide etchant (BOE) to obtain the relief structure [24] and the current-confined area [241].

In another state of art, the second DBR [23], the light emitting region [22] and a part of the first DBR [21] are laterally covered by the insulation layer [30]; and, two extended ends of the insulation layer [30] defines an area having a 22 μm diameter.

In another state of art, the extended structure [20] is grown on a semi-insulated GaAs substrate [10]. The first DBR [21] located below comprises 30 pairs of interlaced $Al_{0.9}Ga_{0.1}As/Al_{0.12}Ga_{0.88}As$. The light emitting region [22] in the middle includes three $In_{0.15}Al_{0.1}Ga_{0.75}As/Al_{0.3}Ga_{0.7}As$ MQWs. An $Al_{0.98}Ga_{0.02}As$ layer is located 100 nm above the light emitting region [22] (MQWs) and is used to form the relief structure [24]. The second DBR [23] located above comprises 20 pairs of interlaced $Al_{0.9}Ga_{0.1}As/Al_{0.12}Ga_{0.88}As$.

The present disclosure is a 850 nm VCSEL MQWs having a group III composition reaching 0.15 indium mole fraction and a well width reaching 50 Å; meanwhile, the well structure does not obviously affect lattice constant (stress). Hence, the present disclosure is improved in static and dynamic performances and wafer consistency.

The relief structure [24] is formed at the $Al_{0.98}Ga_{0.02}As$ layer above the MQWs. After the $Al_{0.98}Ga_{0.02}As$ is partially laterally turned into $Al_xO_{1-x}$ through oxidation, the $Al_xO_{1-x}$ layer (i.e. oxide layer) is removed through an etching process with a BOE. A relief structure [24] with <6 μm current confined area (refer to FIG. 1) can be easily formed by the process, mainly due to the good etching selectivity of BOE between the $Al_{0.98}Ga_{0.02}As$ layer and the $Al_xO_{1-x}$ layer.

Figure 3:
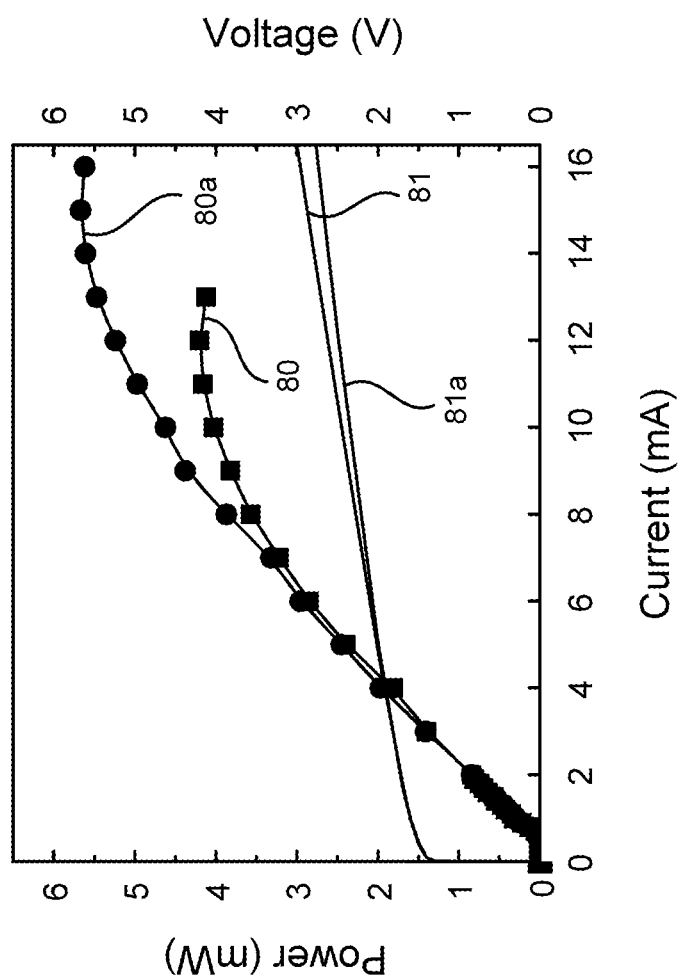
FIG. 3 is the view showing the L-I curves and the I-V curves.

Please refer to FIG. 3, which is a view showing L-I curves and I-V curves. As shown in the figure, curves of optical power output to bias current 80,80a for a preferred embodiment and a control are shown, respectively. Therein, the preferred embodiment and the control have almost the same threshold current and differential quantum efficiency. Although the biggest power of the preferred embodiment is 4 mW and is lower than 5.6 mW for the biggest power of the control, it is not a problem to the present disclosure for the main concern is on low power consumption (i.e. low current) and high speed operation. In the other hand, curves of bias current to voltage 81,81a for the preferred embodiment and the control are shown, respectively. Therein, the preferred embodiment and the control have almost the same turn on voltage and differential resistance. Hence, static performance of VCSEL according to the preferred embodiment is not affected by relief structure.

Figure 4A:
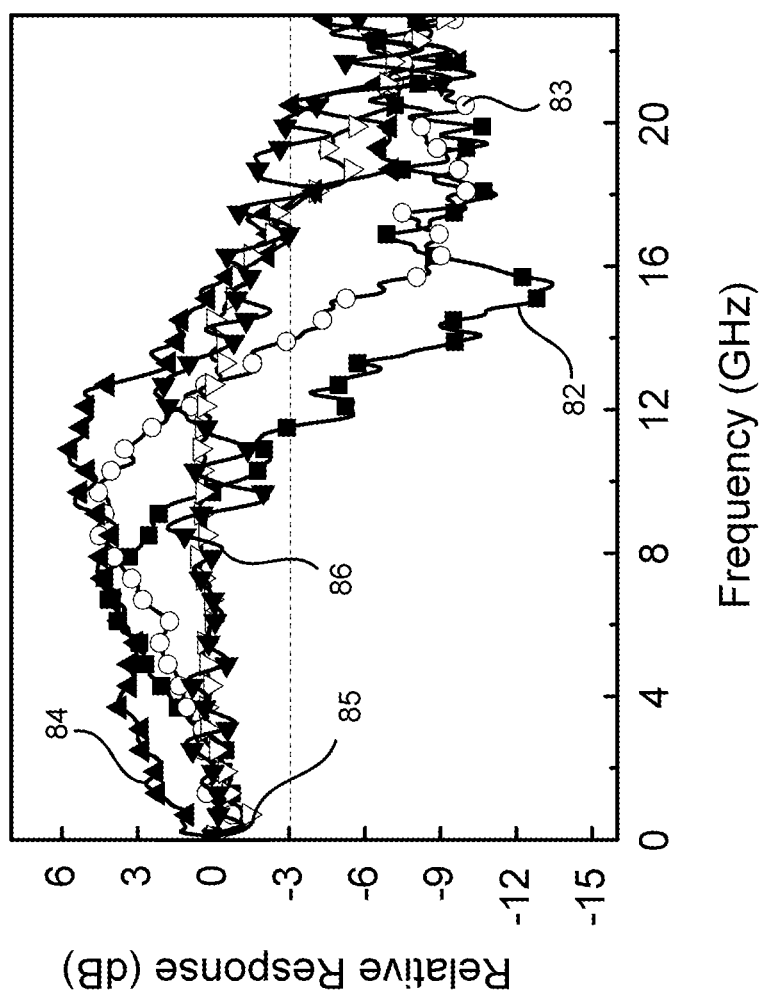
FIG. 4A is the view showing the E-O frequency response curves.
Figure 4B:
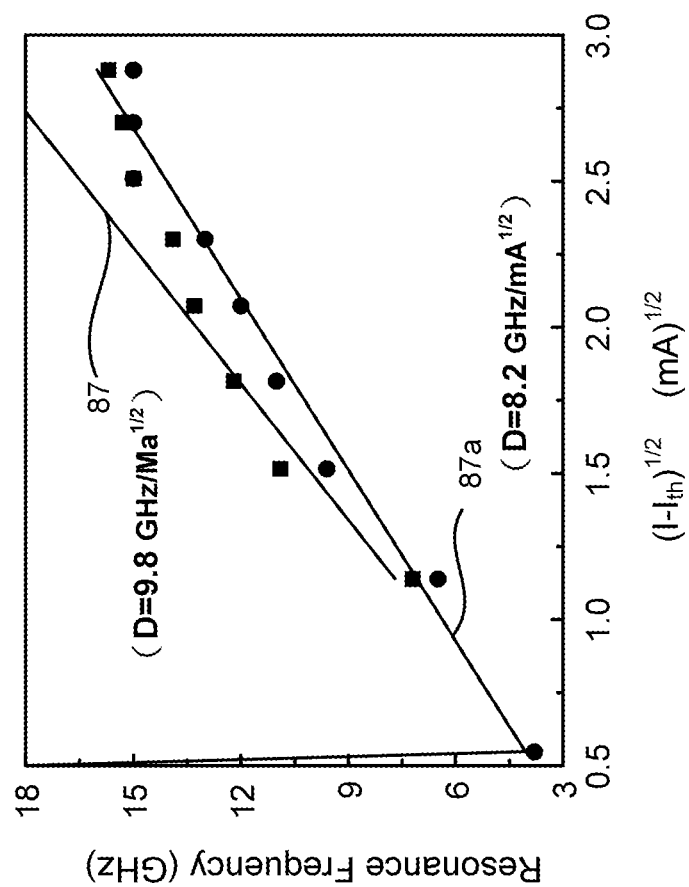
FIG. 4B is the view showing the $f_R$-to-$(I-I_{th})^{1/2}$ fitting lines.

Please refer to FIG. 4A and FIG. 4B, which are views showing E-O frequency response curves and $f_R$-to-$(I-I_{th})^{1/2}$ fitting lines. As shown in the figures, from electrical-to-optical frequency response curves under biases of 2 mA, 3 mA, 4 mA, 7 mA and 9 mA, the present disclosure effectively reduces parasitic capacity in FIG. 4A for achieving 3 dB bandwidth under 21 GHz. In FIG. 4B, current modulation efficiencies (i.e. D factors) of a VCSEL device having a relief structure are shown. Resonance frequency ($f_R$) and $(I-I_{th})^{1/2}$ are measured, where I is bias current and $I_{th}$ is threshold current. From the curves of $f_R$ vs $(I-I_{th})^{1/2}$ 87,87a, the D factor for the present disclosure reaches 9.8 $GHz/mA^{1/2}$, higher than 8.2 $GHz/mA^{1/2}$ for a control. Hence, current of the present disclosure processed through oxide relief is raised faster than that of the control following rising of resonance frequency.

Please refer to FIG. 5A to FIG. 5C, which are views showing $-\log(BER)$-to-$V_{pp}$ curves with 12.5 Gbit/sec bias current, $-\log(BER)$-to-$V_{pp}$ curves with 34 Gbit/sec bias current, and $-\log(BER)$-to-$V_{pp}$ curves with 28 Gbit/sec bias current under 85° C. As shown in the figures, the present disclosure is at first measured for its $-\log(BER)$ peek-to-peek driving voltage ($V_{pp}$) under a 12.5 Gbit/sec bias current at room temperature. In FIG. 5A, a VCSEL device obtains a relief structure by removing an oxide layer to reach an error-free 12.5 Gbit/sec eye under a 1.7 mA bias current and a very low $V_{pp}$, which means a 9.2 Gbps/mW·ratio of data transmission velocity to power consumption.

Through a further comparison under 0.5V $V_{pp}$ with a bias current raised to 6 mA, the present disclosure reaches an error-free operational velocity for 34 Gbps after an relief process. In FIG. 5B, a ratio of data transmission velocity to power consumption reaches 2.9 Gbps/mW.

In FIG. 5C, the present disclosure is operated at a 85° C. temperature under a 6 mA bias current for reaching a 28 Gbit/sec error-free operational velocity, which shows a good I-V characteristic and a low power consumption even under a high temperature.

The present disclosure is a high-speed VCSEL device with a 850 nm wavelength, which obtains a relief structure by removing an oxide layer. By removing the oxide layer of the 850 nm VCESL, the present disclosure reaches a current modulation efficiency of 8.2 vs. 9.8 GHz/mA$^{1/2}$ and a biggest modulation velocity of 32 vs. 34 Gbps with low power consumption. The high ratio of data transmission to power consumption for the present disclosure reaches 2.9 and 9.2 Gbps/mW under 34 and 12.5 Gbps, respectively. Moreover, for the static performances including characteristics of current-to-power (L-I) and current-to-voltage (I-V), the present disclosure still has good performance even with the relief structure formed by removing the oxide layer.

To sum up, the present disclosure is a VCSEL, where a relief structure is formed at least 100 nm above an active layer through an etching process; and where profound static performances are obtained, including low power consumption, biggest operational speed, and high ratio of data transmission to power consumption as 2.9 and 9.2 Gbps/mW under 34 and 12.5 Gbps, respectively.

The preferred embodiment herein disclosed is not intended to unnecessarily limit the scope of the disclosure. Therefore, simple modifications or variations belonging to the equivalent of the scope of the claims and the instructions disclosed herein for a patent are all within the scope of the present disclosure.

What is claimed is:

1. A vertical-cavity surface-emitting laser (VCSEL) device comprising:
    a substrate;
    an extended structure, said extended structure being positioned on an upper surface of said substrate, said extended structure comprising:
        a first distributed Bragg reflector (DBR),
        a second DBR,
        a light emitting region arranged between the first and second DBRs, and
        a relief structure arranged at least 100 nanometers above said light emitting region so as to not contact the light emitting region, said relief structure being a partially oxidized aluminum (Al) composition layer laterally etched off, and
        a central current-confined area comprising a centrally arranged intact remainder of the Al composition layer that is not oxidized and etched off;
    an insulation layer, said insulation layer having a light emitting aperture, said insulation layer being extended from two ends of said light emitting aperture to cover a part of said first DBR, said light emitting region and said second DBR, wherein said relief structure is positioned within an area between said two extended ends of said insulation layer to align a center of said light emitting aperture with said current-confined area;
    a p-type contact and pad arranged above the substrate; and
    an n-type contact and pad also arranged above the substrate.

2. The VCSEL device according to claim 1, wherein said first DBR is an n-type DBR and second DBR is a p-type DBR.

3. The VCSEL device according to claim 1, wherein said first DBR is a p-type DBR and second DBR is an n-type DBR.

4. The VCSEL device according to claim 1, wherein said Al composition layer is partially converted into an oxide layer with central area of said Al composition layer remained intact and said oxide layer is removed through selective-etching to obtain said relief structure and said current-confined area.

5. The VCSEL device according to claim 4, wherein said oxide layer is removed through said selective-etching by using a buffered oxide etchant (BOE) to obtain said relief structure and said current-confined area.

6. The VCSEL device according to claim 1, wherein said current-confined area is circular and has an area having a diameter of less than 25 micrometers (μm).

7. The VCSEL device according to claim 1, wherein said substrate is a semi-insulated semiconductor.

8. The VCSEL device according to claim 7, wherein said semi-insulated semiconductor is a material selected from a group consisting of gallium arsenide (GaAs), indium phosphide (InP), aluminum nitride (AlN), indium nitride (InN) and silicon (Si).

9. The VCSEL device according to claim 1, wherein said light emitting region is a heterojunction made of a compound semiconductor and an alloy of said compound semiconductor; and wherein said light emitting region is InAlGaAs/AlGaAs.

10. The VCSEL device according to claim 1, wherein said light emitting region has multiple quantum wells (MQWs) comprising three InAlGaAs/AlGaAs; and wherein said light emitting region is sandwiched by a p-DBR and an n-DBR through epitaxy.

11. The VCSEL device according to claim 1, wherein said second DBR, said light emitting region and a part of said first DBR are laterally covered by said insulation layer.

* * * * *